US 11,764,752 B2

(12) United States Patent
Nakagawa

(10) Patent No.: US 11,764,752 B2
(45) Date of Patent: Sep. 19, 2023

(54) ELASTIC WAVE DEVICE

(71) Applicant: Murata Manufacturing Co., Ltd., Nagaokakyo (JP)

(72) Inventor: Masatoshi Nakagawa, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 1271 days.

(21) Appl. No.: 16/218,526

(22) Filed: Dec. 13, 2018

(65) Prior Publication Data
US 2019/0222194 A1 Jul. 18, 2019

(30) Foreign Application Priority Data
Jan. 12, 2018 (JP) .................................. 2018-003865

(51) Int. Cl.
*H03H 9/02* (2006.01)
*H03H 9/10* (2006.01)
(Continued)

(52) U.S. Cl.
CPC ......... *H03H 9/02905* (2013.01); *H01L 24/05* (2013.01); *H01L 24/97* (2013.01);
(Continued)

(58) Field of Classification Search
CPC ......... H01L 24/05; H01L 24/97; H01L 24/13; H01L 24/16; H01L 2224/05624;
(Continued)

(56) References Cited

U.S. PATENT DOCUMENTS

2002/0101304 A1* 8/2002 Onishi ................. H03H 9/0547
333/193
2004/0169444 A1* 9/2004 Higuchi ................ H03H 9/059
310/348
(Continued)

FOREIGN PATENT DOCUMENTS

| CN | 1507150 A | 6/2004 |
| CN | 105794107 A | 7/2016 |
| JP | 2004-201285 A | 7/2004 |

OTHER PUBLICATIONS

First Office Action in CN201910030150.X, dated Oct. 21, 2022, 8 pages.

*Primary Examiner* — S M Sohel Imtiaz
(74) *Attorney, Agent, or Firm* — KEATING & BENNETT, LLP

(57) ABSTRACT

An elastic wave device includes an elastic wave element chip, a bump electrically connected to the elastic wave element chip, a package substrate including an electrode bonded to the bump, the elastic wave element chip mounted on the package substrate with the bump, and a sealing resin portion covering the elastic wave element chip on the package substrate. A space surrounded by the elastic wave element chip, the package substrate, and the sealing resin portion is provided. The elastic wave element chip includes a substrate having piezoelectricity, an interdigital transducer electrode, and a pad electrode. A first main surface of the substrate having piezoelectricity includes a first region and a second region closer to a second main surface than the first region. The interdigital transducer electrode is disposed in the first region. The pad electrode is disposed in the second region and bonded to the bump.

19 Claims, 4 Drawing Sheets

(51) Int. Cl.
  *H03H 9/05* (2006.01)
  *H01L 23/00* (2006.01)
(52) U.S. Cl.
  CPC .... *H03H 9/02834* (2013.01); *H03H 9/02866* (2013.01); *H03H 9/059* (2013.01); *H03H 9/1085* (2013.01); *H01L 24/13* (2013.01); *H01L 24/16* (2013.01); *H01L 2224/0568* (2013.01); *H01L 2224/05624* (2013.01); *H01L 2224/05639* (2013.01); *H01L 2224/05644* (2013.01); *H01L 2224/05647* (2013.01); *H01L 2224/05655* (2013.01); *H01L 2224/05664* (2013.01); *H01L 2224/05666* (2013.01); *H01L 2224/05669* (2013.01); *H01L 2224/05671* (2013.01); *H01L 2224/05684* (2013.01); *H01L 2224/13101* (2013.01); *H01L 2224/13144* (2013.01); *H01L 2224/81444* (2013.01); *H01L 2224/97* (2013.01); *H01L 2924/01013* (2013.01); *H01L 2924/10157* (2013.01); *H01L 2924/181* (2013.01); *H01L 2924/3511* (2013.01)

(58) Field of Classification Search
  CPC . H01L 2224/05644; H01L 2224/05647; H01L 2224/97; H01L 2924/01013; H01L 2924/10157; H01L 2924/181; H03H 9/02834; H03H 9/02866; H03H 9/059; H03H 9/1085; H03H 9/02905
  See application file for complete search history.

(56) References Cited

U.S. PATENT DOCUMENTS

| | | | |
|---|---|---|---|
| 2009/0051245 A1* | 2/2009 | Takayama | H03H 9/1092 29/25.35 |
| 2010/0225202 A1* | 9/2010 | Fukano | H03H 9/105 310/313 C |
| 2016/0294354 A1* | 10/2016 | Saijo | H03H 9/14544 |
| 2017/0063328 A1* | 3/2017 | Tochishita | H03H 3/08 |
| 2019/0103372 A1* | 4/2019 | Chen | H01L 23/3142 |

\* cited by examiner

ELASTIC WAVE DEVICE

CROSS REFERENCE TO RELATED APPLICATIONS

This application claims the benefit of priority to Japanese Patent Application No. 2018-003865 filed on Jan. 12, 2018. The entire contents of this application are hereby incorporated herein by reference.

BACKGROUND OF THE INVENTION

1. Field of the Invention

The present invention relates to elastic wave devices, and more particularly, to an elastic wave device including an elastic wave element chip and a package substrate facing the elastic wave element chip.

2. Description of the Related Art

Surface acoustic wave devices each including a mounting board (packaging substrate) and a surface acoustic wave element (elastic wave element chip) mounted by flip-chip bonding on the mounting board have been known (for example, see Japanese Unexamined Patent Application Publication No. 2004-201285).

In a surface acoustic wave device disclosed in Japanese Unexamined Patent Application Publication No. 2004-201285, a surface acoustic wave element includes at least one comb-shaped electrode portion (interdigital transducer electrode) on a piezoelectric substrate and bumps. The surface acoustic wave element is connected to a mounting board by bonding the bumps on the surface acoustic wave element to electrodes, such as lands, on the mounting board. The comb-shaped electrode portion is disposed on a surface of the piezoelectric substrate facing the mounting board. In the surface acoustic wave device, the surface acoustic wave element is covered and sealed with a sealing resin. A gap (space) is provided between the mounting board and a functional portion (a region of the surface acoustic wave element in which the comb-shaped electrode portion is disposed and through which an surface acoustic wave propagates), thus allowing the surface acoustic wave to propagate.

In the surface acoustic wave device disclosed in Japanese Unexamined Patent Application Publication No. 2004-201285, a shorter gap length of the gap between the surface acoustic wave element and the mounting board (package substrate) is less likely to lead to the entry of the resin into the gap. However, when a thermal shock test is performed, bonding portions of the bumps and the electrodes, such as lands, are cracked, in some cases.

SUMMARY OF THE INVENTION

Preferred embodiments of the present invention provide elastic wave devices each having improved reliability of a bonding portion between a bump and an electrode of a package substrate in a thermal shock test while the formation of a portion of a sealing resin portion is prevented between an interdigital transducer electrode and the package substrate.

According to a preferred embodiment of the present invention, an elastic wave device includes an elastic wave element chip, at least one bump, a package substrate, and a sealing resin portion. The at least one bump is electrically connected to the elastic wave element chip. The package substrate includes an electrode bonded to the at least one bump. The elastic wave element chip is mounted on the package substrate with the at least one bump. The sealing resin portion covers the elastic wave element chip on the package substrate. In the elastic wave device, a space surrounded by the elastic wave element chip, the package substrate, and the sealing resin portion is provided. The elastic wave element chip includes a substrate having piezoelectricity, an interdigital transducer electrode, and at least one pad electrode. The substrate having piezoelectricity includes a first main surface adjacent to the space and a second main surface facing away from the space. The first main surface includes a first region and a second region closer to the second main surface than the first region. The interdigital transducer electrode is disposed in the first region. The at least one pad electrode is disposed in the second region and bonded to the at least one bump.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Elastic wave devices according to preferred embodiments of the present invention will be described below with reference to the attached drawings.

FIGS. 1 to 4 are schematic drawings, and ratios between respective sizes and thicknesses of the elements do not necessarily reflect actual dimensional ratios.

First Preferred Embodiment

An elastic wave device 1 according to a first preferred embodiment of the present invention will be described below with reference to FIG. 1.

Figure 1:
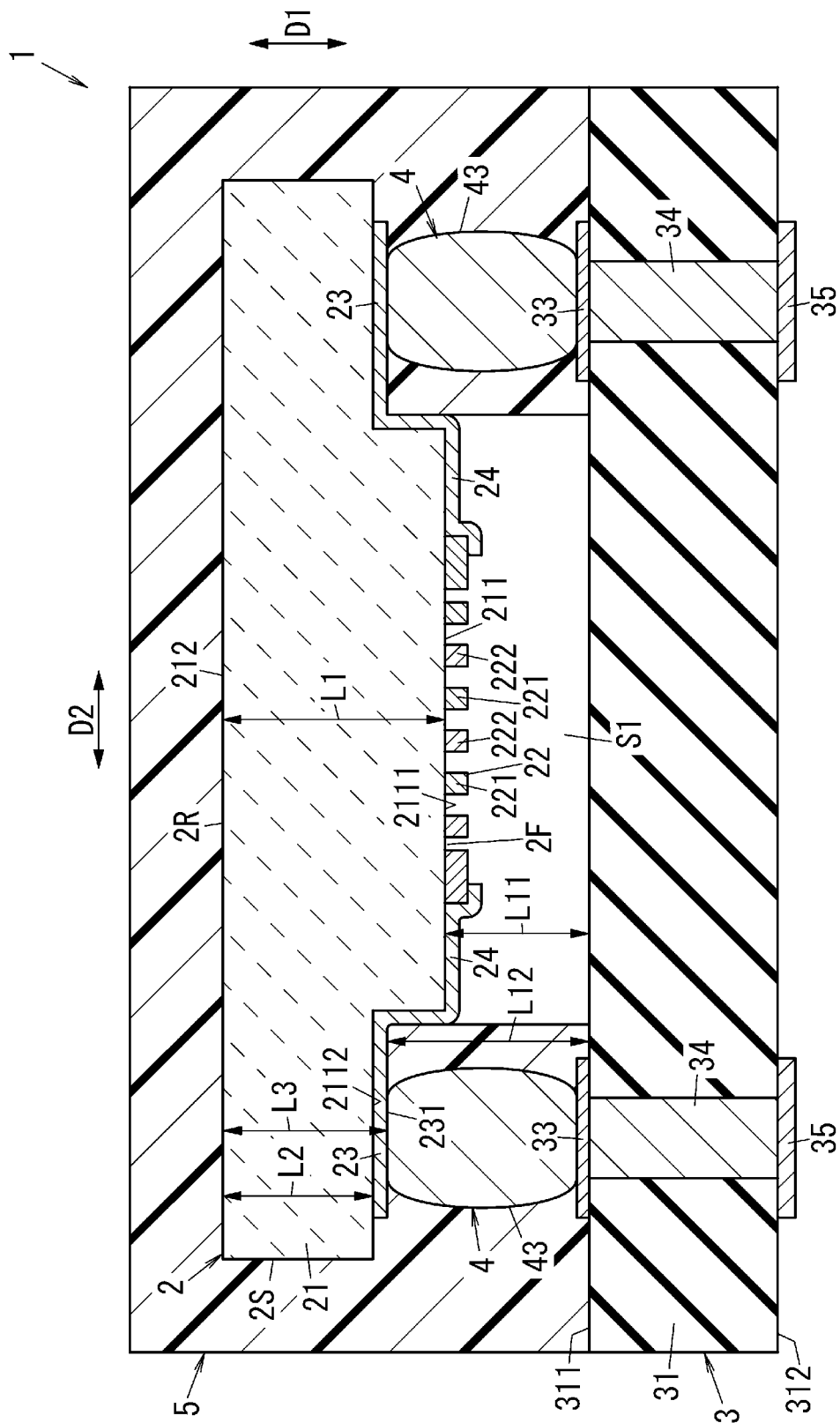
FIG. 1 is a cross-sectional view of an elastic wave device according to a first preferred embodiment of the present invention.

As illustrated in FIG. 1, the elastic wave device 1 according to the first preferred embodiment includes an elastic wave element chip 2, a package substrate 3, bumps (for example, six bumps) 4, and a sealing resin portion 5. The elastic wave element chip 2 includes pad electrodes 23 and a first main surface 2F including surfaces of the pad electrodes 23. The package substrate 3 faces the first main surface 2F of the elastic wave element chip 2 in the thickness direction D1 of the elastic wave element chip 2 and includes electrodes (for example, six electrodes) 33. The package substrate 3 includes a support 31 that supports the electrodes 33. The bumps 4 electrically connect the pad electrodes 23 of the elastic wave element chip 2 to the electrodes 33 of the package substrate 3. The sealing resin portion 5 covers a second main surface 2R of the elastic wave element chip 2 on the package substrate 3, the second main surface 2R facing away from the package substrate 3, and side surfaces 2S of the elastic wave element chip 2. In the elastic wave device 1, a space S1 surrounded by the elastic wave element chip 2, the package substrate 3, and the sealing resin portion 5 is provided.

The elastic wave element chip 2 includes a substrate 21 having piezoelectricity, interdigital transducer electrodes (for example, three interdigital transducer electrodes) 22, and the pad electrodes (for example, six pad electrodes) 23. The substrate 21 having piezoelectricity includes a first main surface 211 adjacent to the space S1 (adjacent to the package substrate 3) in the thickness direction D1 and a second main surface 212 facing away from the space S1. The interdigital transducer electrodes 22 are disposed on the substrate 21 having piezoelectricity. Each of the pad electrodes 23 is electrically connected to at least one of the interdigital transducer electrodes 22. More specifically, the pad electrodes 23 are electrically connected to the interdigital transducer electrodes 22 through wiring layers 24. The pad electrodes 23 are bonded to the respective bumps 4. Among the pad electrodes 23 in the elastic wave element chip 2, a subset of the pad electrodes 23 may preferably be a dummy pad electrode, for example, that is not electrically connected to the interdigital transducer electrodes 22. The "dummy pad electrode" used here is an electrode used to improve the parallelism of the elastic wave element chip 2 to the package substrate 3 and is different from the electrodes used to provide electrical connection. That is, the "dummy pad electrode" is an electrode that prevents inclined mounting of the elastic wave element chip 2 on the package substrate 3. Thus, the dummy pad electrode is not necessarily provided, depending on, for example, the number and arrangement of the pad electrodes 23.

The elastic wave device 1 is preferably a chip-size package (CSP) elastic wave device, for example. The elastic wave element chip 2 is flip-chip mounted on the package substrate 3 such that the package substrate 3 faces the first main surface 2F of the elastic wave element chip 2. The second main surface 2R and the side surfaces 2S of the elastic wave element chip 2 are covered with the sealing resin portion 5 on the package substrate 3. The package substrate 3 and the sealing resin portion 5 are slightly larger in size than the chip size of the elastic wave element chip 2 when viewed in the thickness direction D1 of the elastic wave element chip 2. The "first main surface 2F of the elastic wave element chip 2" is a surface of the elastic wave element chip 2 on which the interdigital transducer electrodes 22 and the pad electrodes 23 are provided in the thickness direction D1 of the elastic wave element chip 2. The first main surface 2F of the elastic wave element chip 2 includes an exposed region of the first main surface 211 of the substrate 21 having piezoelectricity, surfaces of the interdigital transducer electrodes 22, surfaces 231 of the pad electrodes 23, and surfaces of the wiring layers 24. The exposed region is an exposed region of the first main surface 211 on which the interdigital transducer electrodes 22, the pad electrodes 23, the wiring layers 24, and other elements are not stacked.

In the elastic wave device 1, the elastic wave element chip 2 is electrically and mechanically connected to the package substrate 3. In the elastic wave device 1, the substrate 21 having piezoelectricity in the elastic wave element chip 2, the support 31 of the package substrate 3, the bumps 4, and the sealing resin portion 5 have different coefficients of linear expansion from one another.

Elements of the elastic wave device 1 will be described below with reference to the drawings.

The substrate 21 having piezoelectricity is a piezoelectric substrate. The piezoelectric substrate is preferably, for example, a $LiTaO_3$ substrate. The piezoelectric substrate is not limited to the $LiTaO_3$ substrate and may be, for example, a $LiNbO_3$ substrate. The substrate 21 having piezoelectricity supports the interdigital transducer electrodes 22. The substrate 21 having piezoelectricity includes the first main surface 211 and the second main surface 212 facing away from each other in the thickness direction D1 of the elastic wave element chip 2. The first main surface 211 is adjacent to the space S1. The second main surface 212 is opposite to the space S1. The substrate 21 having piezoelectricity preferably has a rectangular or substantially rectangular shape when viewed in plan (peripheral shape of the substrate 21 having piezoelectricity when viewed in the thickness direction D1). The shape of the substrate 21 having piezoelectricity is not limited to the rectangular or substantially rectangular shape and may be a square or substantially square shape, for example.

The interdigital transducer electrodes 22 may preferably be made of, for example, an appropriate metal material such as Al, Cu, Pt, Au, Ag, Pd, Ti, Ni, Cr, Mo, W, or an alloy mainly including any of these metals. Each of the interdigital transducer electrodes 22 may have a structure in which metal films made of the metal or alloy are stacked.

Each of the interdigital transducer electrodes 22 includes a first busbar, a second busbar, first electrode fingers 221, and second electrode fingers 222.

Each of the first busbar and the second busbar has an elongated shape with a longitudinal direction extending in a second direction D2 perpendicular or substantially perpendicular to the thickness direction D1 (first direction) of the elastic wave element chip 2. In each of the interdigital transducer electrodes 22, the first busbar and the second busbar face each other in a third direction perpendicular or substantially perpendicular to both of the first direction (the thickness direction D1 of the elastic wave element chip 2) and the second direction D2.

The first electrode fingers 221 are connected to the first busbar and extend toward the second busbar. The first electrode fingers 221 extend from the first busbar in a direction (third direction) perpendicular or substantially perpendicular to the longitudinal direction (second direction D2) of the first busbar. Ends of the first electrode fingers 221 are spaced away from the second busbar. For example, the first electrode fingers 221 preferably have the same or substantially the same length and width.

The second electrode fingers 222 are connected to the second busbar and extend toward the first busbar. The second electrode fingers 222 extend from the second busbar in a direction perpendicular or substantially perpendicular to the longitudinal direction (second direction D2) of the second busbar. Ends of the second electrode fingers 222 are spaced away from the first busbar. For example, the second electrode fingers 222 preferably have the same or substantially the same length and width.

In each of the interdigital transducer electrodes 22, the first electrode fingers 221 and the second electrode fingers 222 are alternately arranged with a distance therebetween in a direction (second direction D2) perpendicular or substantially perpendicular to a direction in which the first busbar and the second busbar face each other. Thus, adjacent first electrode finger 221 and second electrode finger 222 in the second direction D2 are spaced away from each other. The period of the electrode fingers in each of the interdigital transducer electrodes 22 is defined as a distance between corresponding sides of the adjacent first electrode finger 221 and the second electrode finger 222. An electrode group including the first electrode fingers 221 and the second electrode fingers 222 may be structured such that the first electrode fingers 221 and the second electrode fingers 222 are disposed with a distance maintained therebetween in the second direction D2. For example, the elastic wave element chip 2 may preferably include both of a region in which the first electrode fingers 221 and the second electrode fingers 222 are alternately arranged with a distance maintained therebetween and a region in which two first electrode fingers 221 or two second electrode fingers 222 are disposed side by side in the second direction D2.

Each of the pad electrodes 23 is electrically connected to at least one of the interdigital transducer electrodes 22. The pad electrodes 23 may preferably be made of, for example, an appropriate metal material such as Al, Cu, Pt, Au, Ag, Pd, Ti, Ni, Cr, Mo, W, or an alloy mainly including any of these metals. Each of the pad electrodes 23 may have a structure in which metal films made of the metal or alloy are stacked.

Each of the wiring layers 24 electrically connects a corresponding one of the pad electrodes 23 to the interdigital transducer electrodes 22. The wiring layers 24 may preferably be made of an appropriate metal material such as Al, Cu, Pt, Au, Ag, Pd, Ti, Ni, Cr, Mo, W or an alloy mainly including any of these metals. Each of the wiring layers 24 may have a structure in which metal films made of the metal or alloy are stacked.

Each of the wiring layers 24 overlaps a portion of a corresponding one of the interdigital transducer electrodes 22 and a portion of the substrate 21 having piezoelectricity in the thickness direction D1 of the elastic wave element chip 2. Each of the wiring layers 24 is integrated with a corresponding one of the pad electrodes 23. Each of the pad electrodes 23 is located inside the periphery of the elastic wave element chip 2 when viewed in plan in the thickness direction D1 of the elastic wave element chip 2.

The package substrate 3 is a substrate on which the elastic wave element chip 2 is mounted. In the elastic wave device 1, one elastic wave element chip 2 is mounted on the package substrate 3. The package substrate 3 is larger than the elastic wave element chip 2 when viewed in plan in the thickness direction D1 of the elastic wave element chip 2.

The package substrate 3 includes the support 31, the electrodes 33 supported by the support 31, and external connection electrodes 35 supported by the support 31. The package substrate further includes through-vias 34 electrically connecting the electrodes 33 to the outer connection electrodes 35 on a one-to-one basis.

The support 31 is electrically insulating. The support 31 has a flat or substantially flat plate shape and includes a first surface 311 and a second surface 312 facing away from each other in the thickness direction D1. The support 31 preferably has a rectangular or substantially rectangular peripheral shape.

The support 31 of the package substrate 3 is preferably made of, for example, a ceramic substrate, such as an alumina substrate. The electrodes 33 are disposed on the first surface 311 of the support 31. The electrodes 33 are conductive layers to which the pad electrodes 23 of the elastic wave element chip 2 are connected through the bumps 4. The electrodes 33 are connected to the bumps 4. The material of each of the electrodes 33 preferably includes, for example, Au. Each of the electrodes 33 preferably has, for example, a stacked structure of metal layers. The uppermost metal layer of the stacked structure is preferably an Au layer, for example. The structure of each of the electrodes 33 is not limited to the stacked structure including the metal layers and may have a single-layer structure.

The outer connection electrodes 35 are disposed on the second surface 312 of the support 31. The outer connection electrodes 35 are conductive layers used when the elastic wave device 1 is mounted on, for example, a printed wiring board. The outer connection electrodes 35 are electrically connected to the respective electrodes 33 through the through-vias 34. The material of each of the outer connection electrodes 35 preferably includes, for example, Au.

Each of the through-vias 34 may preferably be made of an appropriate metal material such as Cu, Ni, or an alloy mainly including any of these metals.

The bumps 4 are electrically conductive. Each of the bumps 4 is bonded and electrically connected to a corresponding one of the pad electrodes 23 of the elastic wave element chip 2. The bumps 4 are bonded and electrically connected to the electrodes 33 facing the respective pad electrodes 23 of the package substrate 3 in the thickness direction D1 of the elastic wave element chip 2. The bumps 4 may preferably be made of, for example, Au or solder.

In the elastic wave device 1, the sealing resin portion 5 covers the second main surface 2R and the side surfaces 2S of the elastic wave element chip 2 mounted on the package substrate 3. The sealing resin portion 5 covers the substrate 21 having piezoelectricity on the package substrate 3. The sealing resin portion 5 preferably has a rectangular or substantially rectangular shape when viewed in plan (as the shape of the periphery when viewed in the thickness direction D1 of the elastic wave element chip 2). The shape of the sealing resin portion 5 is not limited to the rectangular or substantially rectangular shape and may be a square or substantially square shape, for example. The size of the peripheral shape of the sealing resin portion 5 is equal or substantially equal to that of the peripheral shape of the package substrate 3 when viewed in plan in the thickness direction D1 of the elastic wave element chip 2.

The sealing resin portion 5 is electrically insulating. The material of the sealing resin portion 5 preferably includes, for example, a synthetic resin such as an epoxy-based resin or a polyimide-based resin.

The sealing resin portion 5 defines and functions as a sealing layer with which the elastic wave element chip 2 on the package substrate 3 is sealed. The elastic wave device 1 includes the hollow space S1 surrounded by the elastic wave element chip 2, the package substrate 3, and the sealing resin portion 5. The sealing resin portion 5 does not to cover the interdigital transducer electrodes 22 of the elastic wave element chip 2.

A non-limiting example of a method for producing the elastic wave device 1 will be briefly described below.

In the method for producing the elastic wave device 1, first, a dicing step of dicing a wafer defining and functioning as the elastic wave element chips 2 is performed to obtain the elastic wave element chips 2 from the wafer. The elastic wave element chips 2 are mounted by flip-chip bonding (face-down bonding) on a motherboard to be formed into the package substrates 3. Thus, the elastic wave element chips 2 are flip-chip mounted on the motherboard. A resin layer to be formed into the sealing resin portions 5 is provided on a surface of the motherboard on which the elastic wave element chips 2 are mounted, such that the resin layer covers the elastic wave element chips 2 on the motherboard. The resin layer may be provided by arranging a resin sheet including a synthetic resin such as an epoxy-based resin or a polyimide-based resin. A method for providing the resin layer is not limited to the arrangement of the resin sheet. For example, the resin layer may be provided by an application method. Heating the resin layer under pressure forms a sealing resin layer to be formed into the sealing resin portions 5. The resulting structure including the motherboard, the elastic wave element chips 2, and the sealing resin layer is diced to form the elastic wave devices 1.

In the elastic wave element chip 2, the first main surface 211 of the substrate 21 having piezoelectricity includes a first region 2111 and a second region 2112 closer to the second main surface 212 of the substrate 21 having piezoelectricity than the first region 2111. Each of the first region 2111 and the second region 2112 has a flat or substantially flat shape. The step height between the first region 2111 and the second region 2112 in the thickness direction D1 of the elastic wave element chip 2 is preferably, for example, about 3 μm. The step height between the first region 2111 and the second region 2112 is not limited to about 3 μm and is preferably, for example, about 1 μm or more and about 10 μm or less. The second region 2112 is formed by, for example, dry-etching a portion of the substrate 21 having piezoelectricity before the formation of the pad electrodes 23. In the elastic wave element chip 2, the interdigital transducer electrodes 22 are disposed on the first region 2111 and located adjacent to the space S1. In the elastic wave element chip 2, the pad electrodes 23 are disposed on the second region 2112.

On the first main surface 211 of the substrate 21 having piezoelectricity in the elastic wave element chip 2, the first region 2111 is spaced away from the periphery of the first main surface 211, and the second region 2112 is at least partially disposed between the periphery of the first main surface 211 and the first region 2111. In the elastic wave element chip 2, the second region 2112 surrounds the entire or substantially the entire circumference of the first region 2111 when viewed in plan in the thickness direction D1 of the elastic wave element chip 2. In the elastic wave element chip 2, the second region 2112 has a size sufficient to provide the pad electrodes 23 therein. The size of the second region 2112 is not limited thereto. A plurality of second regions may be provided at different portions, each of the second regions having a size sufficient to a corresponding one of the pad electrodes 23. Regarding the second region 2112, the substrate 21 having piezoelectricity may include at least one second region 2112 or may include the plurality of second regions 2112.

In the elastic wave element chip 2, the second main surface 212 of the substrate 21 having piezoelectricity has a flat or substantially flat shape. In the elastic wave element chip 2, a length L2 between the second main surface 212 of the substrate 21 having piezoelectricity and the second region 2112 is shorter than a length L1 between the second main surface 212 of the substrate 21 having piezoelectricity and the first region 2111. The length L2 is shorter than the length L1 by, for example, the step height described above. That is, the length L2 is preferably shorter than the length L1 by, for example, about 3 μm. In the elastic wave element chip 2, for example, the length L1 between the second main surface 212 of the substrate 21 having piezoelectricity and the first region 2111 is preferably about 120 μm, and the length L2 is preferably about 117 μm, for example.

In the elastic wave element chip 2, a length L3 between the second main surface 212 of the substrate 21 having piezoelectricity and a surface 231 of the pad electrode 23 is shorter than the length L1 between the second main surface 212 of the substrate 21 having piezoelectricity and the first region 2111.

The sealing resin portion 5 covers the second main surface 2R and the side surfaces 2S of the elastic wave element chip 2 as described above. Furthermore, the sealing resin portion 5 covers outer peripheral surfaces 43 of the bumps 4 between the second region 2112 of the first main surface 211 of the substrate 21 having piezoelectricity and the package substrate 3. That is, a portion of the sealing resin portion 5 is disposed between the second region 2112 of the first main surface 211 of the substrate having piezoelectricity and the package substrate 3. The sealing resin portion 5 is preferably in contact with the entire or substantially the entire circumference of the outer peripheral surface 43 of each of the bumps 4. The sealing resin portion 5 may include a portion interposed between the first region 2111 of the first main surface 211 of the substrate 21 having piezoelectricity and the package substrate 3 unless the portion of the sealing resin portion 5 extends to the interdigital transducer electrodes 22. Preferably, the sealing resin portion 5 is not disposed between the first region 2111 of the first main surface 211 of the substrate 21 having piezoelectricity and the package substrate 3.

An elastic wave device according to a comparative example has the same or substantially the same basic structure as the elastic wave device 1 according to the first preferred embodiment and differs from the elastic wave device according to the first preferred embodiment in that the elastic wave device according to the comparative example includes an elastic wave element chip in which the first main surface of the piezoelectric substrate has a flat or substantially flat shape and the interdigital transducer electrodes and the pad electrodes are disposed on the flat or substantially flat first main surface, in place of the elastic wave element chip 2 of the elastic wave device according to the first preferred embodiment. Thus, in the elastic wave device according to the comparative example, the length between a surface of the support in the thickness direction of the elastic wave element chip and the first main surface of the piezoelectric substrate of the elastic wave element chip is constant or substantially constant at any position on the first main surface of the piezoelectric substrate.

The results of a thermal shock test of a sample of the elastic wave device according to the comparative example will be described below. The thermal shock test used here is a rapid temperature change test with two liquid baths according to JIS C 60068-2-14 and IEC 60068-2-14. In the rapid temperature change test with two liquid baths, the temperature of a liquid in a low-temperature-liquid bath was about −55° C., and the temperature of a liquid in a high-temperature-liquid bath was about 125° C. In the rapid temperature change test with two liquid baths, the time for immersing a sample in the liquid in the low-temperature-liquid bath was about 15 minutes, and the time for immersing a sample in the liquid in the high-temperature-liquid bath was about 15 minutes.

In the elastic wave device according to the comparative example, the elastic wave element chip had dimensions of about 2.5 mm×about 2.0 mm. The piezoelectric substrate had a thickness of about 120 μm. The piezoelectric substrate was made of $LiTaO_3$. The interdigital transducer electrodes were made of Al. The support of the package substrate was made of alumina. The bumps were made of Au. Each of the bumps of the elastic wave device had an outside diameter of about 120 μm. The sealing resin portion was made of an epoxy-based resin.

Table 1 presents the number of defective items per 50 samples at different heights of the bumps (height of the bumps in the elastic wave device) in the structure of the elastic wave device according to the comparative example and different numbers of thermal shock cycles. In Table 1, the denominator of each fraction indicates the number of samples, and the numerator indicates the number of defective items. Whether the item is defective or not is determined based on the measurement results of the electric characteristics.

TABLE 1

| Height of bump | Number of thermal shock cycles | | | |
|---|---|---|---|---|
| (μm) | about 400 | about 600 | about 800 | about 1,000 |
| about 5 | about 1/50 | about 2/50 | about 2/50 | about 3/50 |
| about 8 | about 0/50 | about 0/50 | about 1/50 | about 2/50 |
| about 10 | about 0/50 | about 0/50 | about 0/50 | about 2/50 |
| about 12 | about 0/50 | about 0/50 | about 0/50 | about 0/50 |
| about 15 | about 0/50 | about 0/50 | about 0/50 | about 0/50 |
| about 25 | about 0/50 | about 0/50 | about 0/50 | about 0/50 |

Regarding the elastic wave device according to the comparative example, Table 2 represents a defective rate due to the inflow of the resin into the gap between the elastic wave element chip and the mounting board when the length (gap length) between the region of the first main surface of the piezoelectric substrate of the elastic wave element chip at which the interdigital transducer electrodes are disposed and (a surface of the support of) the package substrate are changed. The phrase "defective rate due to the inflow of the resin" refers to the rate of defective items per number of samples. Whether the item is defective or not is determined by whether the inflow width of the resin from an edge of the elastic wave element chip or from the pad electrode to the inside is equal to or more than a predetermined width (here, about 50 μm) or not. An item in which the inflow width of the resin is equal to or more than the predetermined width is determined to be a defective item. An item in which the inflow width of the resin is less than the predetermined width is determined to be a good item. Regarding the elastic wave device according to the comparative example, when the inflow width of the resin is equal to or more than the predetermined width, it is confirmed in advance that desired electrical characteristics are not obtained.

TABLE 2

| Gap length (μm) | Defective rate (%) |
|---|---|
| about 5 | about 0 |
| about 8 | about 0 |
| about 10 | about 0 |
| about 12 | about 0.04 |
| about 15 | about 0.12 |
| about 20 | about 0.15 |
| about 25 | about 0.4 |
| about 30 | about 0.9 |
| about 40 | about 1.8 |
| about 50 | about 4.0 |
| about 60 | about 8.0 |

Table 1 indicates that in the elastic wave device according to the comparative example, the bumps need to have a height of about 12 μm or more from the viewpoint of reducing the defective rate in the thermal shock test. Table 2 indicates that in the elastic wave device according to the comparative example, the bumps need to have a height of about 10 μm or less (and more than the total thickness of the thickness of the interdigital transducer electrodes and the thickness of the wiring layers) from the viewpoint of reducing the defective rate due to the inflow of the resin. Tables 1 and 2 indicate that when an attempt is made to reduce the defective rate in the thermal shock test by increasing the height of the bumps, the defective rate due to the inflow of the resin tends to increase. In contrast, in the elastic wave device 1 according to the first preferred embodiment, because the first main surface 211 of the substrate 21 having piezoelectricity includes the first region 2111 and the second region 2112, the height of the bumps 4 is able to be increased without changing the gap length, compared with the elastic wave device according to the comparative example. This results in a reduction in the defective rate due to the inflow of the resin during production and a reduction in the rate of defective bonding portions of the bumps 4 and the electrodes 33 in the thermal shock test in the elastic wave device 1 according to the first preferred embodiment. In the elastic wave device 1 according to the first preferred embodiment, the gap length between the region of the first main surface 211 of the substrate 21 having piezoelectricity in the elastic wave element chip 2 at which the interdigital transducer electrodes 22 are disposed and the package substrate 3 is a length L11 between the first region 2111 of the first main surface 211 of the substrate 21 having piezoelectricity and (the first surface 311 of the support 31 of) the package substrate 3. In the elastic wave device 1 according to the first preferred embodiment, preferably, for example, the length L11 may be about 10 μm, and the bumps 4 may have a height of about 12 μm. The height of the bumps 4 is equal or substantially equal to the length between the pad electrodes 23 of the elastic wave element chip 2 and the electrodes 33 of the package substrate 3.

The elastic wave device 1 according to the first preferred embodiment includes the elastic wave element chip 2, the bumps 4, the package substrate 3, and the sealing resin portion 5. The bumps 4 are electrically connected to the elastic wave element chip 2. The package substrate 3 includes the electrodes 33 bonded to the bumps 4. The elastic wave element chip 2 is mounted with the bumps 4. The sealing resin portion 5 covers the elastic wave element chip 2 on the package substrate 3. In the elastic wave device 1, the space S1 surrounded by the elastic wave element chip 2, the package substrate 3, and the sealing resin portion 5 is provided. The elastic wave element chip 2 includes the substrate 21 having piezoelectricity, the interdigital transducer electrodes 22, and the pad electrodes. The substrate 21 having piezoelectricity includes the first main surface 211 facing the space S1 and the second main surface 212 facing away from the space S1. The first main surface 211 includes the first region 2111 and the second region 2112 closer to the second main surface 212 than the first region 2111. The interdigital transducer electrodes 22 are disposed in the first region 2111 and face the space S1. The pad electrodes 23 are disposed in the second region 2112 and bonded to the bumps 4.

In the elastic wave device 1 according to the first preferred embodiment, the bumps 4 are bonded to the electrodes 33 of the package substrate 3. The interdigital transducer electrodes 22 are disposed in the first region 2111 of the first main surface 211 of the substrate 21 having piezoelectricity in the elastic wave element chip 2. The pad electrodes 23 bonded to the bumps 4 are disposed in the second region 2112 of the first main surface 211 of the substrate 21 having piezoelectricity. The length L12 between the second region 2112 and (the first surface 311 of the support 31 of) the package substrate 3 is greater than the length L11 between the first region 2111 and (the first surface 311 of the support 31 of) the package substrate 3. Thus, in the elastic wave device 1 according to the first preferred embodiment, the height of the bumps 4 is able to be increased without changing the gap length, thus improving the reliability of the bonding portions of the bumps 4 and the electrodes 33 of the package substrate 3 in the thermal shock test while the formation of a portion of the sealing resin portion 5 is prevented between the interdigital transducer electrodes 22 and the package substrate 3.

On the first main surface 211 of the substrate 21 having piezoelectricity in the elastic wave device 1 according to the first preferred embodiment, the first region 2111 is spaced away from the periphery of the first main surface 211, and the second region 2112 is closer to the periphery of the first main surface 211 than the first region 2111. Thus, in the elastic wave device 1 according to the first preferred embodiment, a portion of the sealing resin portion 5 is not easily disposed between the first main surface 211 of the substrate 21 having piezoelectricity and the package substrate 3.

In the elastic wave device 1 according to the first preferred embodiment, the length L2 between the second main surface 212 of the substrate 21 having piezoelectricity and the second region 2112 is shorter than the length L1 between the second main surface 212 of the substrate 21 having piezoelectricity and the first region 2111. Thus, in the elastic wave device 1 according to the first preferred embodiment, the second region 2112 of the first main surface 211 of the substrate 21 having piezoelectricity is able to be formed by, for example, an etching technique in the production of the elastic wave element chip 2.

In the elastic wave device 1 according to the first preferred embodiment, the length L3 between the second main surface 212 of the substrate 21 having piezoelectricity and the surface 231 of each of the pad electrodes 23 is shorter than the length L1 between the second main surface 212 of the substrate 21 having piezoelectricity and the first region 2111. Thus, in the elastic wave device 1 according to the first preferred embodiment, the reliability in the thermal shock test is able to be improved while the formation of a portion of the sealing resin portion 5 between the interdigital transducer electrodes 22 and the package substrate 3 is more reliably prevented.

In the elastic wave device 1 according to the first preferred embodiment, the sealing resin portion 5 covers the outer peripheral surface 43 of at least one of the bumps 4 provided between the second region 2112 of the first main surface 211 of the substrate 21 having piezoelectricity and the package substrate 3. Thus, in the elastic wave device 1 according to the first preferred embodiment, the bonding portion between the at least one of the bumps 4 and a corresponding one of the pad electrodes 23 and the bonding portion between the at least one of the bumps 4 and a corresponding one of electrodes 33 is able to be reinforced with the sealing resin portion 5, thus improving the connection reliability.

In the elastic wave device 1 according to the first preferred embodiment, the substrate 21 having piezoelectricity is a piezoelectric substrate. Thus, in the elastic wave device 1, the second region 2112 of the first main surface 211 is able to be formed by partially etching the piezoelectric substrate during the production of the elastic wave element chip 2.

Second Preferred Embodiment

An elastic wave device 1a according to a second preferred embodiment of the present invention will be described with reference to FIG. 2.

The elastic wave device 1a according to the second preferred embodiment includes an elastic wave element chip 2a instead of the elastic wave element chip 2 of the elastic wave device 1 according to the first preferred embodiment (see FIG. 1). Regarding the elastic wave device 1a according to the second preferred embodiment, the same or similar elements as those in the elastic wave device 1 according to the first preferred embodiment are designated using the same reference numerals, and descriptions are not redundantly repeated.

A substrate 21a having piezoelectricity in the elastic wave element chip 2a is a stacked substrate unlike the piezoelectric substrate defining the substrate 21 having piezoelectricity in the elastic wave element chip 2 of the elastic wave device 1 according to the first preferred embodiment. Specifically, the substrate 21a having piezoelectricity is a stacked substrate including a supporting substrate 25, a low-acoustic-velocity film 27a, and a piezoelectric film 210a.

The low-acoustic-velocity film 27a is disposed on the supporting substrate 25. The expression "the low-acoustic-velocity film 27a is disposed on the supporting substrate 25" used herein includes the case in which the low-acoustic-velocity film 27a is disposed directly on the supporting substrate 25 and the case in which the low-acoustic-velocity film 27a is disposed indirectly on the supporting substrate 25. The piezoelectric film 210a is disposed on the low-acoustic-velocity film 27a. The expression "the piezoelectric film 210a is disposed on the low-acoustic-velocity film 27a" used herein includes the case in which the piezoelectric film 210a is disposed directly on the low-acoustic-velocity film 27a and the case in which the piezoelectric film 210a is disposed indirectly on the low-acoustic-velocity film 27a. The acoustic velocity of a bulk wave that propagates through the low-acoustic-velocity film 27a is lower than the acoustic velocity of an elastic wave that propagates through the piezoelectric film 210a. The acoustic velocity of a bulk wave that propagates through the supporting substrate 25 is higher than the acoustic velocity of an elastic wave that propagates through the piezoelectric film 210a.

In the elastic wave element chip 2a, the piezoelectric film 210a is preferably made of, for example, $LiTaO_3$. The low-acoustic-velocity film 27a is preferably made of, for example, silicon oxide. The supporting substrate 25 is preferably made of, for example, silicon.

Denoting the wavelength of an elastic wave as $\lambda$, the wavelength being determined by the period of the electrode fingers of the interdigital transducer electrodes 22, the piezoelectric film 210a preferably has a film thickness of about $3.5\lambda$ or less, for example. This is because a high quality factor is provided. A film thickness of the piezoelectric film 210a of about $2.5\lambda$ or less, for example, results in improved frequency-temperature characteristics. The use of a film thickness of the piezoelectric film 210a of about $1.5\lambda$ or less, for example, facilitates the adjustment of the acoustic velocity.

Denoting the wavelength of an elastic wave as $\lambda$, the wavelength being determined by the period of the electrode fingers of the interdigital transducer electrodes 22, the low-acoustic-velocity film 27a preferably has a film thickness of about $2.0\lambda$ or less, for example. A film thickness of the low-acoustic-velocity film 27a of about $2.0\lambda$ or less, for example may result in a reduction in film stress to reduce the warpage of a wafer including a silicon wafer defining and functioning as the supporting substrate 25 during production. This enables an improvement in good item rate and stabilization of the characteristics.

When the low-acoustic-velocity film 27a is made of silicon oxide, the temperature characteristics is able to be improved. LiTaO$_3$ has an elastic constant with negative temperature characteristics. Silicon oxide has an elastic constant with positive temperature characteristics. Thus, the elastic wave device 1a according to the second preferred embodiment has a low absolute value of the temperature coefficient of frequency (TCF). Furthermore, the specific acoustic impedance of silicon oxide is lower than that of LiTaO$_3$. Thus, the elastic wave device 1a has both of an increased electromechanical coupling coefficient, i.e., an increased band width ratio, and improved frequency-temperature characteristics.

In the elastic wave element chip 2a, the second region 2112 of the first main surface 211 of the substrate 21a having piezoelectricity is formed by partially etching the stacked substrate from a surface of the piezoelectric film 210a to the middle of the supporting substrate 25. Thus, on the first main surface 211 of the substrate 21a having piezoelectricity in the elastic wave element chip 2a, the first region 2111 is defined by the surface of the piezoelectric film 210a, and the second region 2112 is defined by a surface of the supporting substrate 25.

The elastic wave element chip 2a further includes an electrical insulating layer 28 covering a portion of the first main surface 211 of the substrate 21a having piezoelectricity and extending from the second region 2112 to the first region 2111. In the elastic wave element chip 2a, the electrical insulating layer 28 is partially interposed between the pad electrodes 23 and the second region 2112. Each of the electrical insulating layers is also interposed between a portion of each of the wiring layers 24 and the supporting substrate 25. Thus, in the elastic wave element chip 2a, the pad electrodes 23 are electrically insulated from the substrate 21a having piezoelectricity. The electrical insulating layer 28 is preferably made of, for example, a polyimide resin.

As with the elastic wave device 1 according to the first preferred embodiment, in the elastic wave device 1a according to the second preferred embodiment, the length L12 between the second region 2112 of the first main surface 211 of the substrate 21a having piezoelectricity and (the first surface 311 of the support 31 of) the package substrate 3 is able to be greater than the length L11 between the first region 2111 of the first main surface 211 of the substrate 21a having piezoelectricity in the elastic wave element chip 2a and (the first surface 311 of the support 31 of) the package substrate 3. Thus, in the elastic wave device 1a according to the second preferred embodiment, the height of the bumps 4 is able to be increased without changing the gap length, thus improving the reliability of the bonding portions of the bumps 4 and the electrodes 33 of the package substrate 3 in the thermal shock test while the formation of a portion of the sealing resin portion 5 is prevented between the interdigital transducer electrodes 22 and the package substrate 3.

In the elastic wave device 1a according to the second preferred embodiment, the piezoelectric film 210a does not overlap the pad electrodes 23 when viewed in plan in the thickness direction D1 of the elastic wave element chip 2a. This reduces or prevents the application of force from the pad electrodes 23 to the piezoelectric film 210a to reduce or prevent the occurrence of cracking in the piezoelectric film 210a.

The elastic wave device 1a according to the second preferred embodiment has a low loss and a high quality factor, compared with the case in which the elastic wave element chip 2a does not include the low-acoustic-velocity film 27a.

In the elastic wave device 1a according to the second preferred embodiment, the supporting substrate 25 of the substrate 21a having piezoelectricity is preferably a silicon substrate, for example. Thus, the substrate 21a having piezoelectricity has high strength, compared with the case in which the substrate 21 having piezoelectricity in the elastic wave device 1 according to the first preferred embodiment is a piezoelectric substrate.

In the elastic wave device 1a according to the second preferred embodiment, the materials of the electrical insulating layer 28, the piezoelectric film 210a, the low-acoustic-velocity film 27a, and the supporting substrate 25 are not limited to those exemplified above.

For example, the material of the electrical insulating layer 28 is not limited to a polyimide resin and may be an epoxy resin. Furthermore, the material of the electrical insulating layer 28 is not limited to an organic material, such as a polyimide resin or an epoxy resin, and may be an inorganic material, such as silicon oxide or silicon nitride.

The piezoelectric film 210a may preferably be made of, for example, LiTaO$_3$, LiNbO$_3$, ZnO, AlN, or PZT (lead zirconate titanate).

The low-acoustic-velocity film 27a may preferably include, for example, at least one material selected from the group consisting of silicon oxide, glass, silicon oxynitride, tantalum oxide, and a compound that includes silicon oxide including fluorine, carbon, or boron.

The supporting substrate 25 may preferably include at least one material selected from the group consisting of silicon, aluminum nitride, aluminum oxide, silicon carbide, silicon nitride, sapphire, lithium tantalate, lithium niobate, quartz crystal, alumina, zirconia, cordierite, mullite, steatite, forsterite, magnesia, and diamond.

In the elastic wave device 1a, the substrate 21a having piezoelectricity may preferably include, for example, an adhesion layer interposed between the low-acoustic-velocity film 27a and the piezoelectric film 210a, in addition to the low-acoustic-velocity film 27a and the piezoelectric film 210a. In this case, the adhesion between the low-acoustic-velocity film 27a and the piezoelectric film 210a is able to be improved. The adhesion layer is preferably made of, for example, a resin, such as an epoxy resin or a polyimide resin, or a metal. The substrate 21a having piezoelectricity in the elastic wave device 1a may include a dielectric film other than the adhesion layer, the dielectric film being interposed between the low-acoustic-velocity film 27a and the piezoelectric film 210a, on the piezoelectric film 210a, or on the low-acoustic-velocity film 27a.

Third Preferred Embodiment

Figure 3:
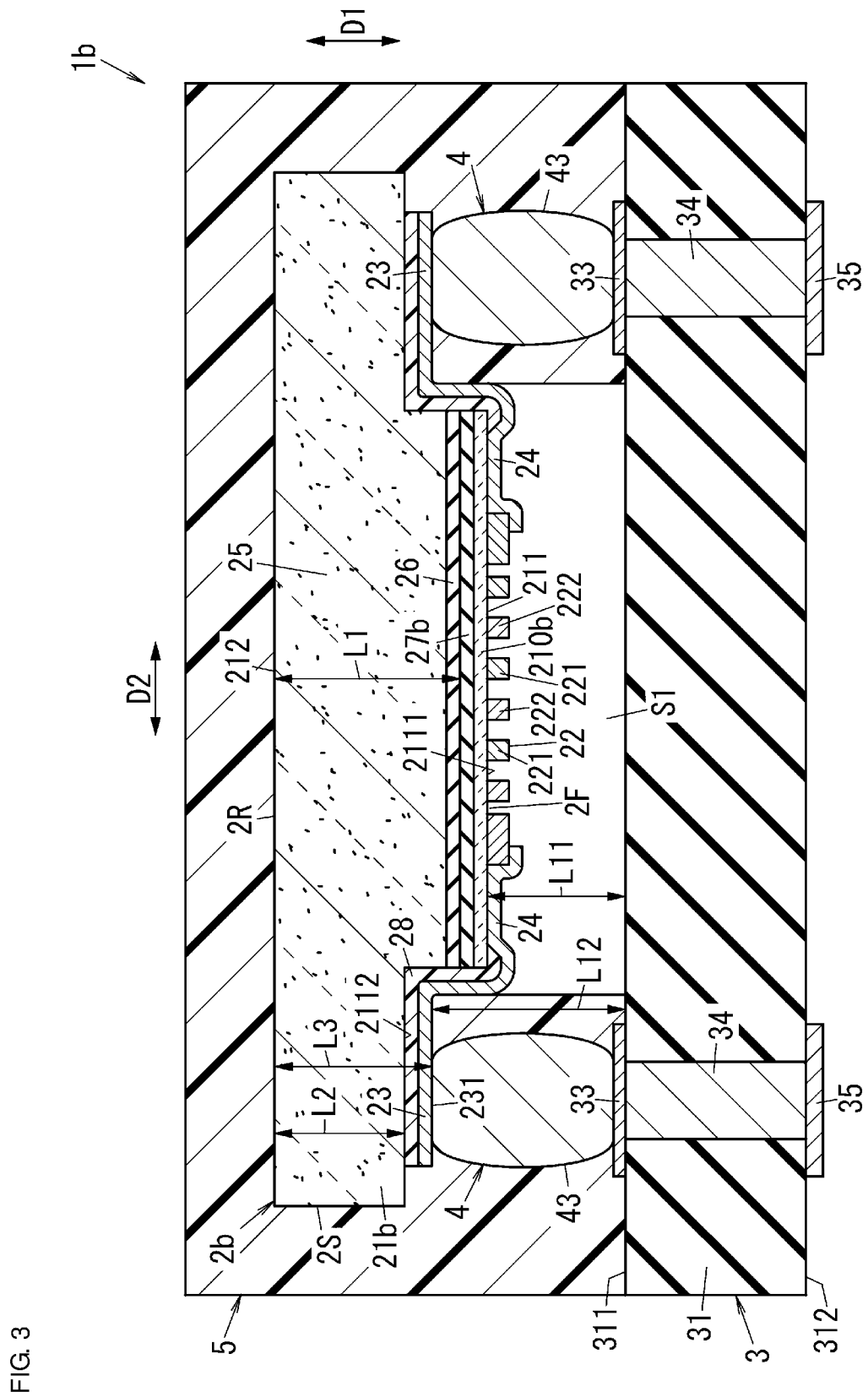
FIG. 3 is a cross-sectional view of an elastic wave device according to a third preferred embodiment of the present invention.

An elastic wave device 1b according to a third preferred embodiment of the present invention will be described below with reference to FIG. 3.

Figure 2:
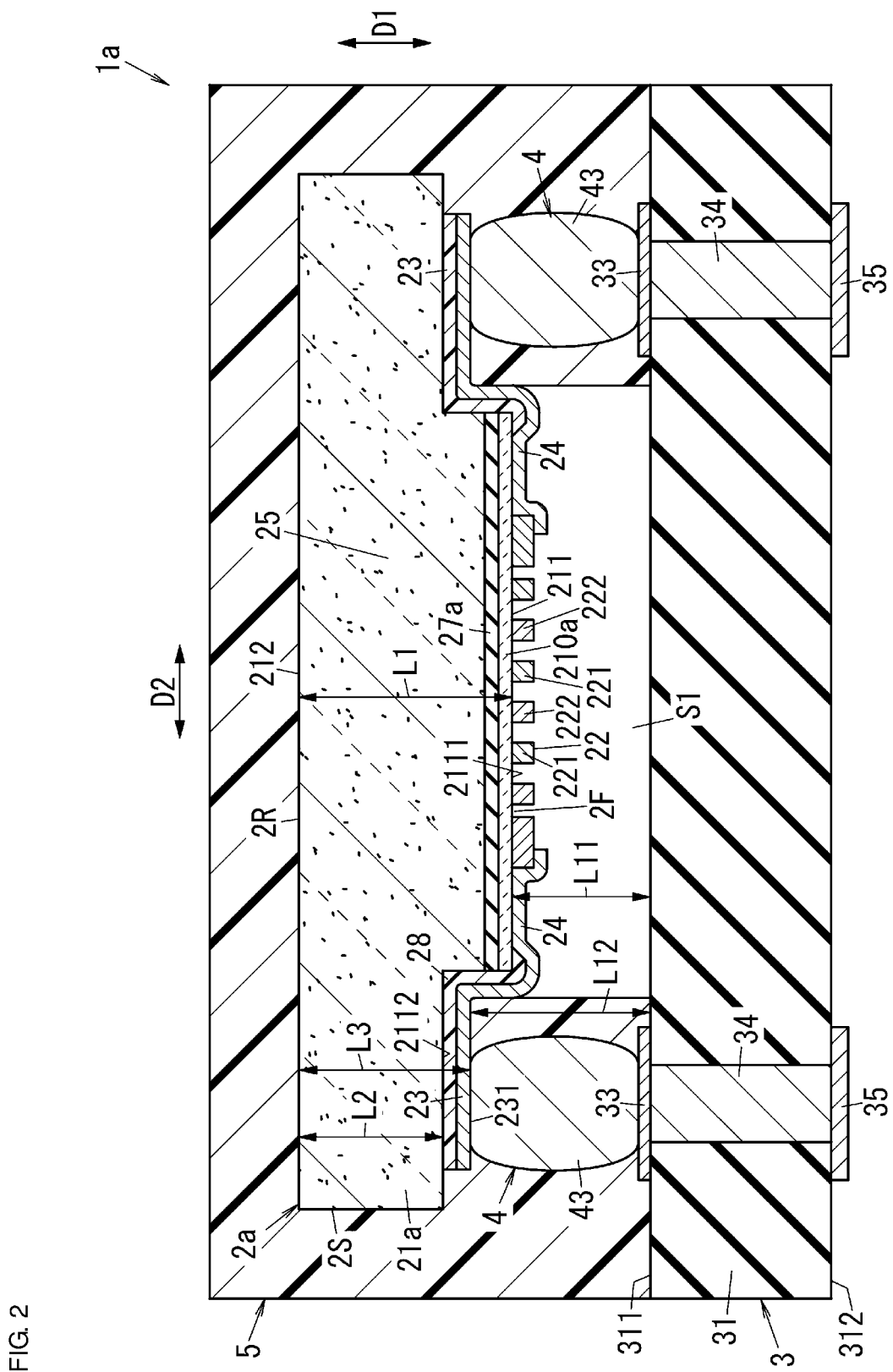
FIG. 2 is a cross-sectional view of an elastic wave device according to a second preferred embodiment of the present invention.

The elastic wave device 1b according to the third preferred embodiment includes an elastic wave element chip 2b instead of the elastic wave element chip 2a of the elastic wave device 1a according to the second preferred embodiment (see FIG. 2). Regarding the elastic wave device 1b according to the third preferred embodiment, the same or similar elements as those in the elastic wave device 1a according to the second preferred embodiment are designated using the same reference numerals, and descriptions are not redundantly repeated.

A substrate 21b having piezoelectricity in the elastic wave element chip 2b is a stacked substrate having a stacked structure different from the substrate 21a having piezoelectricity in the elastic wave element chip 2a of the elastic wave device 1a according to the second preferred embodiment. Specifically, the substrate 21b having piezoelectricity includes the supporting substrate 25, a high-acoustic-velocity film 26, a low-acoustic-velocity film 27b, and a piezoelectric film 210b.

The high-acoustic-velocity film 26 is disposed on the supporting substrate 25. The expression "the high-acoustic-velocity film 26 is disposed on the supporting substrate 25" used herein includes the case in which the high-acoustic-velocity film 26 is disposed directly on the supporting substrate 25 and the case in which the high-acoustic-velocity film 26 is disposed indirectly on the supporting substrate 25. The acoustic velocity of a bulk wave that propagates through the high-acoustic-velocity film 26 is higher than the acoustic velocity of an elastic wave that propagates through the piezoelectric film 210b. The low-acoustic-velocity film 27b is disposed on the high-acoustic-velocity film 26. The expression "the low-acoustic-velocity film 27b is disposed on the high-acoustic-velocity film 26" used herein includes the case in which the low-acoustic-velocity film 27b is disposed directly on the high-acoustic-velocity film 26 and the case in which the low-acoustic-velocity film 27b is disposed indirectly on the high-acoustic-velocity film 26. The acoustic velocity of a bulk wave that propagates through the low-acoustic-velocity film 27b is lower than the acoustic velocity of an elastic wave that propagates through the piezoelectric film 210b. The piezoelectric film 210b is disposed on the low-acoustic-velocity film 27b. The expression "the piezoelectric film 210b is disposed on the low-acoustic-velocity film 27b" used herein includes the case in which the piezoelectric film 210b is disposed directly on the low-acoustic-velocity film 27b and the case in which the piezoelectric film 210b is disposed indirectly on the low-acoustic-velocity film 27b.

The high-acoustic-velocity film 26 of the elastic wave device 1b according to the third preferred embodiment functions such that an elastic wave does not leak to a structure below the high-acoustic-velocity film 26.

Because the elastic wave device 1b includes the substrate 21b having piezoelectricity, the energy of an elastic wave in a specific mode used to obtain the characteristics of a filter or resonator is distributed throughout the piezoelectric film 210b and the low-acoustic-velocity film 27b. The energy is also distributed in a portion of the high-acoustic-velocity film 26 adjacent to the low-acoustic-velocity film 27b. However, the energy is not distributed in the supporting substrate 25. A mechanism to confine an elastic wave with the high-acoustic-velocity film 26 is the same mechanism as the case of a Love wave-type surface wave, which is a non-leaky SH wave. The mechanism is described, for example, in the document entitled "Introduction to Surface Acoustic Wave Device Simulation Technology", Kenya Hashimoto, REALIZE Science and Engineering, p. 26-28. The above-described mechanism is different from a mechanism to confine an elastic wave with Bragg reflectors made of an acoustic multilayer film.

The high-acoustic-velocity film 26 is preferably made of, for example, diamond-like carbon, aluminum nitride, aluminum oxide, silicon carbide, silicon nitride, silicon, sapphire, a piezoelectric material, such as lithium tantalate, lithium niobate, or quartz crystal, a ceramic material, such as alumina, zirconia, cordierite, mullite, steatite, or forsterite, magnesia, diamond, a material mainly including any of these materials, or a material mainly including a mixture of these materials.

Regarding the film thickness of the high-acoustic-velocity film 26, because the high-acoustic-velocity film 26 confines an elastic wave to the piezoelectric film 210b and the low-acoustic-velocity film 27b, a high-acoustic-velocity film 26 having a larger film thickness is more preferable. The substrate 21b having piezoelectricity may include, for example, an adhesion layer or a dielectric film in addition to the high-acoustic-velocity film 26, the low-acoustic-velocity film 27b, and the piezoelectric film 210b.

In the elastic wave element chip 2b, the second region 2112 of the first main surface 211 of the substrate 21b having piezoelectricity is formed by partially etching the stacked substrate from a surface of the piezoelectric film 210b to the middle of the supporting substrate 25. Thus, in the elastic wave element chip 2b, the first region 2111 of the first main surface 211 of the substrate 21b having piezoelectricity is defined by the surface of the piezoelectric film 210b, and the second region 2112 is defined by a surface of the supporting substrate 25.

The elastic wave element chip 2b further includes the electrical insulating layer 28 covering a portion of the first main surface 211 of the substrate 21b having piezoelectricity and extending from the second region 2112 to the first region 2111. In the elastic wave element chip 2b, the electrical insulating layer 28 is partially interposed between the pad electrodes 23 and the second region 2112. The electrical insulating layer 28 is also interposed between a portion of each of the wiring layers 24 and the supporting substrate 25. Thus, in the elastic wave element chip 2b, the pad electrodes 23 are electrically insulated from the substrate 21b having piezoelectricity. The electrical insulating layer 28 is preferably made of, for example, a polyimide resin.

As with the elastic wave device 1 according to the first preferred embodiment, in the elastic wave device 1b according to the third preferred embodiment, the length L12 between the second region 2112 of the first main surface 211 of the substrate 21b having piezoelectricity and (the first surface 311 of the support of) the package substrate 3 is greater than the length L11 between the first region 2111 of the first main surface 211 of the substrate 21b having piezoelectricity in the elastic wave element chip 2b and (the first surface 311 of the support 31 of) the package substrate 3. Thus, in the elastic wave device 1b according to the third preferred embodiment, the height of the bumps 4 is able to be increased without changing the gap length, thus improving the reliability of the bonding portions of the bumps 4 and the electrodes 33 of the package substrate 3 in the thermal shock test while the formation of a portion of the sealing resin portion 5 is prevented between the interdigital transducer electrodes 22 and the package substrate 3.

In the elastic wave device 1b according to the third preferred embodiment, the separation between the piezoelectric film 210b and the pad electrodes 23 is able to reduce or prevent the application of force from the pad electrodes 23 to the piezoelectric film 210b to reduce or prevent the occurrence of cracking in the piezoelectric film 210b.

In the elastic wave device 1b according to the third preferred embodiment, as described above, the substrate 21b having piezoelectricity includes the supporting substrate 25, the high-acoustic-velocity film 26, and the low-acoustic-velocity film 27b. Thus, in the elastic wave device 1b according to the third preferred embodiment, the high-acoustic-velocity film 26 confines an elastic wave to the piezoelectric film 210b and the low-acoustic-velocity film 27b, thus preventing the leakage of an elastic wave to the supporting substrate 25.

In the elastic wave device 1b according to the third preferred embodiment, the supporting substrate 25 in the substrate 21b having piezoelectricity is preferably a silicon substrate, for example. Thus, the substrate 21b having piezoelectricity has high strength, compared with the case in which the substrate 21 having piezoelectricity in the elastic wave device 1 according to the first preferred embodiment is a piezoelectric substrate.

Fourth Preferred Embodiment

Figure 4:
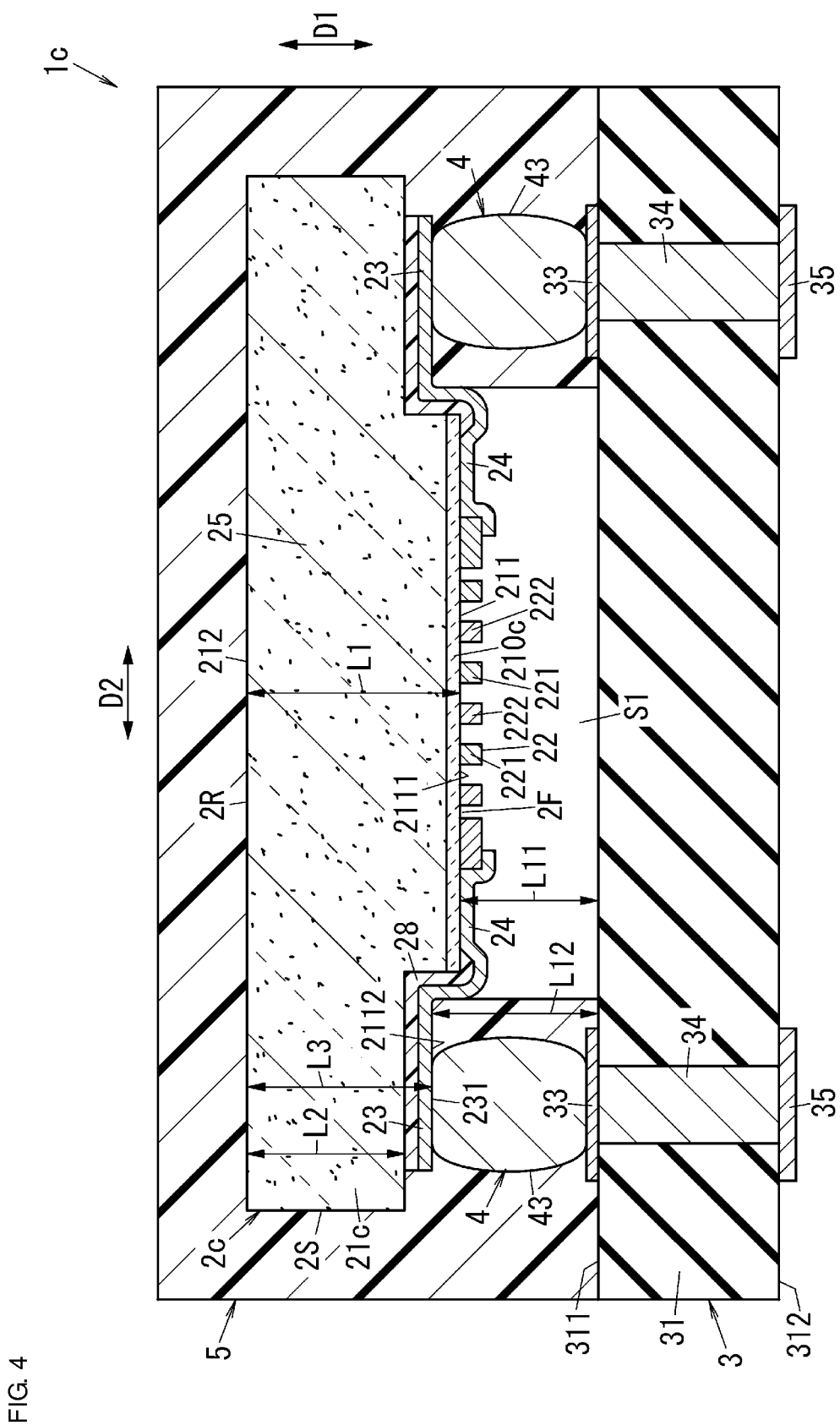
FIG. 4 is a cross-sectional view of an elastic wave device according to a fourth preferred embodiment of the present invention.

An elastic wave device 1c according to a fourth preferred embodiment of the present invention will be described below with reference to FIG. 4.

The elastic wave device 1c according to the fourth preferred embodiment includes an elastic wave element chip 2c instead of the elastic wave element chip 2a of the elastic wave device 1a according to the second preferred embodiment (see FIG. 2). Regarding the elastic wave device 1c according to the fourth preferred embodiment, the same or similar elements as those in the elastic wave device 1a according to the second preferred embodiment are designated using the same reference numerals, and descriptions are not redundantly repeated.

A substrate 21c having piezoelectricity in the elastic wave element chip 2c is a stacked substrate having a stacked structure different from the substrate 21b having piezoelectricity in the elastic wave element chip 2b of the elastic wave device 1b according to the second preferred embodiment. Specifically, the substrate 21c having piezoelectricity includes the supporting substrate 25 and a piezoelectric film 210c. The substrate 21c having piezoelectricity may preferably include, for example, an adhesion layer or a dielectric film disposed on a side of the piezoelectric film 210c adjacent to the supporting substrate 25, in addition to the piezoelectric film 210c. The substrate 21c having piezoelectricity may also include, for example, a dielectric film disposed on a side of the piezoelectric film 210c adjacent to the interdigital transducer electrodes 22.

In the elastic wave element chip 2c, the second region 2112 of the first main surface 211 of the substrate 21c having piezoelectricity is formed by partially etching the stacked substrate from a surface of the piezoelectric film 210c to the middle of the supporting substrate 25. Thus, in the elastic wave element chip 2c, the first region 2111 of the first main surface 211 of the substrate 21c having piezoelectricity is defined by the surface of the piezoelectric film 210c, and the second region 2112 is defined by a surface of the supporting substrate 25.

The elastic wave element chip 2c further includes the electrical insulating layer 28 covering a portion of the first main surface 211 of the substrate 21c having piezoelectricity and extending from the second region 2112 to the first region 2111. In the elastic wave element chip 2c, the electrical insulating layer 28 is partially interposed between at least one of the pad electrodes 23 and the second region 2112. The electrical insulating layer 28 is also interposed between a portion of each of the wiring layers 24 and the supporting substrate 25. Thus, in the elastic wave element chip 2c, the pad electrodes 23 are electrically insulated from the substrate 21c having piezoelectricity. The electrical insulating layer 28 is preferably made of, for example, a polyimide resin.

As with the elastic wave device 1 according to the first preferred embodiment, in the elastic wave device 1c according to the fourth preferred embodiment, the length L12 between the second region 2112 of the first main surface 211 of the substrate 21c having piezoelectricity and (the first surface 311 of the support 31 of) the package substrate 3 is able to be greater than the length L11 between the first region 2111 of the first main surface 211 of the substrate 21c having piezoelectricity in the elastic wave element chip 2c and (the first surface 311 of the support 31 of) the package substrate 3. Thus, in the elastic wave device 1c according to the fourth preferred embodiment, the height of the bumps 4 is able to be increased without changing the gap length, thus improving the reliability of the bonding portions of the bumps 4 and the electrodes 33 of the package substrate 3 in the thermal shock test while the formation of a portion of the sealing resin portion 5 is prevented between the interdigital transducer electrodes 22 and the package substrate 3.

In the elastic wave device 1c according to the fourth preferred embodiment, the separation between the piezoelectric film 210c and the pad electrodes 23 is able to reduce or prevent the application of force from the pad electrodes 23 to the piezoelectric film 210c to reduce or prevent the occurrence of cracking in the piezoelectric film 210c.

In the elastic wave device 1c according to the fourth preferred embodiment, the supporting substrate 25 of the substrate 21c having piezoelectricity is preferably a silicon substrate, for example. Thus, the substrate 21c having piezoelectricity has high strength, compared with the case in which the substrate 21 having piezoelectricity in the elastic wave device 1 according to the first preferred embodiment is a piezoelectric substrate.

Each of the foregoing first to fourth preferred embodiments is merely one of various preferred embodiments of the present invention. The foregoing first to fourth preferred embodiments may be variously modified in accordance with design and other factors as long as the advantageous effects of the present invention are able to be achieved.

For example, the package substrate 3 is not limited to including the support 31 made of a ceramic substrate. For example, the package substrate 3 may include the support 31 made of a resin substrate.

In the elastic wave device 1a, a surface of the supporting substrate 25 on which the stack including the low-acoustic-velocity film 27a and the piezoelectric film 210a is disposed may be flush with the surface of the second region 2112 of the first main surface 211 of the substrate 21a having piezoelectricity. In this case, for example, the use of a selective etching technique in the production of the elastic wave element chip 2a enables an increase in the dimensional accuracy of the step height between the first region 2111 and the second region 2112 of the first main surface 211 of the substrate 21a having piezoelectricity. In the selective etching technique, for example, etching is performed under etching conditions (an etching gas, pressure, and so forth) in which the etching rate of silicon oxide used for the material of the low-acoustic-velocity film 27a is about 10 or more times the etching rate of silicon used for the material of the supporting substrate 25.

In the elastic wave device 1a, the substrate 21a having piezoelectricity may include an acoustic impedance layer instead of the low-acoustic-velocity film 27a between the piezoelectric film 210a and the supporting substrate 25. The acoustic impedance layer reduces or prevents the leakage of an elastic wave excited by the interdigital transducer electrodes 22 to the supporting substrate 25. The acoustic impedance layer has a stacked structure in which at least one high-acoustic-impedance layer having relatively high acoustic impedance and at least one low-acoustic-impedance layer having relatively low acoustic impedance are juxtaposed in the thickness direction D1 of the elastic wave element chip 2a. In the stacked structure, a plurality of high-acoustic-impedance layers may be provided, and a plurality of low-acoustic-impedance layers may be provided. In this case, the stacked structure is a structure in which the high-acoustic-impedance layers and the low-acoustic-impedance layers are alternately stacked in the thickness direction D1.

The high-acoustic-impedance layer is preferably made of, for example, platinum, tungsten, aluminum nitride, lithium tantalate, sapphire, lithium niobate, silicon nitride, or zinc oxide.

The low-acoustic-impedance layer is preferably made of, for example, silicon oxide, aluminum, or titanium.

In each of the elastic wave devices 1, 1a, 1b, and 1c, one or more interdigital transducer electrodes 22 may be used. In the case in which each of the elastic wave devices 1, 1a, 1b, and 1c includes the interdigital transducer electrodes 22, for example, surface acoustic wave resonators including the respective interdigital transducer electrodes 22 may be electrically connected to each other to form a band-pass filter.

In a preferred embodiment of the present invention, the elastic wave device (1, 1a, 1b, or 1c) includes the elastic wave element chip (2, 2a, 2b, or 2c), the bumps (4), the package substrate (3), and the sealing resin portion (5). The bumps (4) are electrically connected to the elastic wave element chip (2, 2a, 2b, or 2c). The package substrate (3) includes the electrodes (33) bonded to the bumps (4). The elastic wave element chip (2, 2a, 2b, or 2c) is mounted with the bumps (4). The sealing resin portion (5) covers the elastic wave element chip (2, 2a, 2b, or 2c) on the package substrate (3). In the elastic wave device (1, 1a, 1b, or 1c), the space (S1) surrounded by the elastic wave element chip (2, 2a, 2b, or 2c), the package substrate (3), and the sealing resin portion (5) is provided. The elastic wave element chip (2, 2a, 2b, or 2c) includes the substrate (21, 21a, 21b, or 21c) having piezoelectricity, the interdigital transducer electrodes (22), and the pad electrodes (23). The substrate (21, 21a, 21b, or 21c) having piezoelectricity includes the first main surface (211) facing the space (S1) and the second main surface (212) facing away from the space (S1). The first main surface (211) includes the first region (2111) and the second region (2112) closer to the second main surface (212) than the first region (2111). The interdigital transducer electrodes (22) are disposed in the first region (2111). The pad electrodes (23) are disposed in the second region (2112) and bonded to the bumps (4).

In an elastic wave device (1, 1a, 1b, or 1c) according to a preferred embodiment of the present invention, the reliability of the bonding portions of the bumps (4) and the electrodes (33) of the package substrate (3) in the thermal shock test is improved while the formation of a portion of the sealing resin portion (5) is prevented between the interdigital transducer electrodes (22) and the package substrate (3).

In an elastic wave device (1, 1a, 1b, or 1c) according to a preferred embodiment of the present invention, the second region (2112) is disposed between the periphery of the first main surface (211) and the first region (2111).

In an elastic wave device (1, 1a, 1b, or 1c) according to a preferred embodiment of the present invention, a portion of the sealing resin portion (5) is not easily formed between the first main surface (211) of the substrate having piezoelectricity (21, 21a, 21b, or 21c) and the package substrate (3).

In an elastic wave device (1, 1a, 1b, or 1c) according to a preferred embodiment of the present invention, the length (L2) between the second main surface (212) and the second region (2112) of the substrate having piezoelectricity (21, 21a, 21b, or 21c) is shorter than the length (L1) between the second main surface (212) and the first region (2111) of the substrate having piezoelectricity (21, 21a, 21b, or 21c).

In an elastic wave device (1, 1a, 1b, or 1c) according to a preferred embodiment of the present invention, the second region (2112) of the first main surface (211) of the substrate having piezoelectricity (21, 21a, 21b, or 21c) may be formed by, for example, an etching technique in the production of the elastic wave element chip (2, 2a, 2b, or 2c).

In an elastic wave device (1, 1a, 1b, or 1c) according to a preferred embodiment of the present invention, the length (L3) between the second main surface (212) of the substrate having piezoelectricity (21, 21a, 21b, or 21c) and the surface (231) of each of the pad electrodes (23) is shorter than the length (L1) between the second main surface (212) and the first region 2111 of the substrate having piezoelectricity (21, 21a, 21b, or 21c).

In an elastic wave device (1, 1a, 1b, or 1c) according to a preferred embodiment of the present invention, the reliability in the thermal shock test is improved while the formation of a portion of the sealing resin portion (5) between the interdigital transducer electrodes (22) and the package substrate (3) is more reliably prevented.

In an elastic wave device (1, 1a, 1b, or 1c) according to a preferred embodiment of the present invention, the sealing resin portion (5) covers the outer peripheral surface (43) of at least one of the bumps (4) provided between the second region (2112) of the first main surface (211) of the substrate having piezoelectricity (21, 21a, 21b, or 21c) and the package substrate (3).

In an elastic wave device (1, 1a, 1b, or 1c) according to a preferred embodiment of the present invention, the bonding portion between the at least one of the bumps (4) and a corresponding one of the pad electrodes (23) and the bonding portion between the at least one of the bumps (4) and a corresponding one of electrodes (33) are reinforced with the sealing resin portion (5), thus improving the connection reliability.

In an elastic wave device (1) according to a preferred embodiment of the present invention, the substrate (21) having piezoelectricity is a piezoelectric substrate.

In an elastic wave device (1) according to a preferred embodiment of the present invention, the second region (2112) of the first main surface (211) of the substrate (21) having piezoelectricity is able to be formed by partially etching the piezoelectric substrate during the production of the elastic wave element chip (2).

In an elastic wave device (1a) according to a preferred embodiment of the present invention, the substrate (21a) having piezoelectricity includes the supporting substrate (25), the low-acoustic-velocity film (27a), and the piezoelectric film (210a). The low-acoustic-velocity film (27a) is disposed on the supporting substrate (25). The piezoelectric film (210a) is disposed on the low-acoustic-velocity film (27a). The acoustic velocity of a bulk wave that propagates through the low-acoustic-velocity film (27a) is lower than the acoustic velocity of an elastic wave that propagates through the piezoelectric film (210a). The acoustic velocity of a bulk wave that propagates through the supporting substrate (25) is higher than the acoustic velocity of an elastic wave that propagates through the piezoelectric film 210a.

An elastic wave device (1a) according to a preferred embodiment of the present invention has a low loss and a high quality factor, compared with the case in which the elastic wave element chip (2a) does not include the low-acoustic-velocity film (27a).

In an elastic wave device (1a) according to a preferred embodiment of the present invention, the piezoelectric film (210a) is made of LiTaO₃, LiNbO₃, ZnO, AlN, or PZT. The low-acoustic-velocity film (27a) includes at least one material selected from the group consisting of silicon oxide, glass, silicon oxynitride, tantalum oxide, and a compound that includes silicon oxide including fluorine, carbon, or boron. The supporting substrate includes at least one material selected from the group consisting of silicon, aluminum nitride, aluminum oxide, silicon carbide, silicon nitride, sapphire, lithium tantalate, lithium niobate, quartz crystal, alumina, zirconia, cordierite, mullite, steatite, forsterite, magnesia, and diamond.

In an elastic wave device 1b according to a preferred embodiment of the present invention, the substrate (21b) having piezoelectricity includes the supporting substrate (25), the high-acoustic-velocity film (26), the low-acoustic-velocity film (27b), and the piezoelectric film (210b). The high-acoustic-velocity film (26) is disposed on the supporting substrate (25). The low-acoustic-velocity film (27b) is disposed on the high-acoustic-velocity film (26). The piezoelectric film 210b is disposed on the low-acoustic-velocity film (27b). The acoustic velocity of a bulk wave that propagates through the high-acoustic-velocity film (26) is higher than the acoustic velocity of an elastic wave that propagates through the piezoelectric film (210b). The acoustic velocity of a bulk wave that propagates through the low-acoustic-velocity film (27b) is lower than the acoustic velocity of an elastic wave that propagates through the piezoelectric film (210b).

In an elastic wave device (1b) according to a preferred embodiment of the present invention, the leakage of an elastic wave to the supporting substrate (25) is reduced or prevented.

In an elastic wave device (1b) according to a preferred embodiment of the present invention, the piezoelectric film (210b) is made of LiTaO₃, LiNbO₃, ZnO, AlN, or PZT. The high-acoustic-velocity film (26) includes at least one material selected from the group consisting of diamond-like carbon, aluminum nitride, aluminum oxide, silicon carbide, silicon nitride, silicon, sapphire, lithium tantalate, lithium niobate, quartz crystal, alumina, zirconia, cordierite, mullite, steatite, magnesia, and diamond. The low-acoustic-velocity film (27b) includes at least one material selected from the group consisting of silicon oxide, glass, silicon oxynitride, tantalum oxide, and a compound that includes silicon oxide including fluorine, carbon, or boron.

In an elastic wave device (1c) according to a preferred embodiment of the present invention, the substrate (21c) having piezoelectricity includes the supporting substrate (25) and the piezoelectric film (210c). The piezoelectric film (210c) is disposed on the supporting substrate (25). The supporting substrate (25) is a silicon substrate. The elastic wave element chip (2c) further includes the electrical insulating layer (28) that covers a portion of the first main surface (211) of the substrate (21c) having piezoelectricity and that extends from the second region (2112) to the first region (2111). The electrical insulating layer (28) is partially interposed between at least one of the pad electrodes (23) and the second region (2112).

In an elastic wave device (1a or 1b) according to a preferred embodiment of the present invention, the supporting substrate (25) is a silicon substrate. The elastic wave element chip (2a or 2b) further includes the electrical insulating layer (28) that covers a portion of the first main surface (211) of the substrate (21a or 21b) having piezoelectricity and that extends from the second region (2112) to the first region (2111). The electrical insulating layer (28) is partially interposed between at least one of the pad electrodes (23) and the second region (2112).

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave device comprising:
   an elastic wave element chip;
   at least one bump electrically connected to the elastic wave element chip;
   a package substrate including an electrode bonded to the at least one bump, the elastic wave element chip being mounted on the package substrate with the at least one bump; and
   a sealing resin portion covering the elastic wave element chip on the package substrate; wherein
   a space surrounded by the elastic wave element chip, the package substrate, and the sealing resin portion is provided,
   the elastic wave element chip includes:
     a substrate having piezoelectricity and including a first main surface adjacent to the space and a second main surface facing away from the space;
     an interdigital transducer electrode disposed in a first region of the first main surface; and
     at least one pad electrode disposed in a second region of the first main surface;
   the second region is closer to the second main surface than the first region;
   the at least one pad electrode is bonded to the at least one bump; and
   a length between the second main surface and the second region of the substrate having piezoelectricity is shorter than a length between the second main surface and the first region of the substrate having piezoelectricity.

2. The elastic wave device according to claim 1, wherein the second region is closer to a periphery of the first main surface than the first region.

3. The elastic wave device according to claim 1, wherein the at least one pad electrode includes a plurality of pad electrodes; and
   a length between the second main surface of the substrate having piezoelectricity and a surface of each of the plurality of pad electrodes is shorter than a length between the second main surface of the substrate having piezoelectricity and the first region.

4. The elastic wave device according to claim 3, wherein the sealing resin portion covers an outer peripheral surface of the bump between the second region of the first main surface of the substrate having piezoelectricity and the package substrate.

5. The elastic wave device according to claim 1, wherein the substrate having piezoelectricity is a piezoelectric substrate.

6. The elastic wave device according to claim 1, wherein the substrate having piezoelectricity includes:
   a supporting substrate;
   a low-acoustic-velocity film disposed on the supporting substrate; and a piezoelectric film disposed on the low-acoustic-velocity film;
an acoustic velocity of a bulk wave that propagates through the low-acoustic-velocity film is lower than an acoustic velocity of an elastic wave that propagates through the piezoelectric film; and
an acoustic velocity of a bulk wave that propagates through the supporting substrate is higher than an acoustic velocity of an elastic wave that propagates through the piezoelectric film.

7. The elastic wave device according to claim 6, wherein the piezoelectric film is made of $LiTaO_3$, $LiNbO_3$, ZnO, AlN, or PZT;
the low-acoustic-velocity film includes at least one material selected from the group consisting of silicon oxide, glass, silicon oxynitride, tantalum oxide, and a compound that contains silicon oxide containing fluorine, carbon, or boron; and
the supporting substrate includes at least one material selected from the group consisting of silicon, aluminum nitride, aluminum oxide, silicon carbide, silicon nitride, sapphire, lithium tantalate, lithium niobate, quartz crystal, alumina, zirconia, cordierite, mullite, steatite, forsterite, magnesia, and diamond.

8. The elastic wave device according to claim 1, wherein the substrate having piezoelectricity includes:
a supporting substrate;
a high-acoustic-velocity film disposed on the supporting substrate;
a low-acoustic-velocity film disposed on the supporting substrate; and
a piezoelectric film disposed on the low-acoustic-velocity film;
an acoustic velocity of a bulk wave that propagates through the high-acoustic-velocity film is higher than an acoustic velocity of an elastic wave that propagates through the piezoelectric film; and
an acoustic velocity of a bulk wave that propagates through the low-acoustic-velocity film is lower than an acoustic velocity of an elastic wave that propagates through the piezoelectric film.

9. The elastic wave device according to claim 8, wherein the piezoelectric film is made of $LiTaO_3$, $LiNbO_3$, ZnO, AlN, or PZT;
the high-acoustic-velocity film includes at least one material selected from the group consisting of diamond-like carbon, aluminum nitride, aluminum oxide, silicon carbide, silicon nitride, silicon, sapphire, lithium tantalate, lithium niobate, quartz crystal, alumina, zirconia, cordierite, mullite, steatite, forsterite, magnesia, and diamond; and
the low-acoustic-velocity film contains at least one material selected from the group consisting of silicon oxide, glass, silicon oxynitride, tantalum oxide, and a compound that includes silicon oxide including fluorine, carbon, or boron.

10. The elastic wave device according to claim 1, wherein the substrate having piezoelectricity includes:
a supporting substrate; and
a piezoelectric film disposed on the supporting substrate;
the supporting substrate is a silicon substrate;
the elastic wave element chip further includes an electrical insulating layer covering a portion of the first main surface of the substrate having piezoelectricity;
the electrical insulating layer extends from the second region to the first region; and
a portion of the electrical insulating layer is interposed between the pad electrode and the second region.

11. The elastic wave device according to claim 6, wherein the supporting substrate is a silicon substrate;
the elastic wave element chip further includes an electrical insulating layer covering a portion of the first main surface of the substrate having piezoelectricity;
the electrical insulating layer extends from the second region to the first region; and
a portion of the electrical insulating layer is interposed between the pad electrode and the second region.

12. The elastic wave device according to claim 5, wherein the piezoelectric substrate is made of $LiTaO_3$.

13. The elastic wave device according to claim 1, wherein the interdigital transducer electrode is made of Al, Cu, Pt, Au, Ag, Pd, Ti, Ni, Cr, Mo, W, or an alloy mainly including any of Al, Cu, Pt, Au, Ag, Pd, Ti, Ni, Cr, Mo, or W.

14. The elastic wave device according to claim 1, wherein the at least one pad electrode is made of Al, Cu, Pt, Au, Ag, Pd, Ti, Ni, Cr, Mo, W, or an alloy mainly including any of Al, Cu, Pt, Au, Ag, Pd, Ti, Ni, Cr, Mo, or W.

15. The elastic wave device according to claim 1, wherein the package substrate includes a support; and
the support is made of a ceramic substrate.

16. The elastic wave device according to claim 15, wherein the electrode included in the package substrate is disposed on a main surface of the support.

17. The elastic wave device according to claim 1, wherein the electrode included in the package substrate is made of Au.

18. The elastic wave device according to claim 1, wherein the at least one bump is made of Au.

19. The elastic wave device according to claim 1, wherein the sealing resin portion includes an epoxy resin or a polyimide resin.

* * * * *